(12) United States Patent
Hayasaka et al.

(10) Patent No.: US 12,243,723 B2
(45) Date of Patent: Mar. 4, 2025

(54) PLASMA PROCESSING APPARATUS

(71) Applicant: Tokyo Electron Limited, Tokyo (JP)

(72) Inventors: Yusuke Hayasaka, Miyagi (JP); Atsushi Sasaki, Miyagi (JP); Kazuya Matsumoto, Miyagi (JP); Shingo Takahashi, Miyagi (JP); Koichi Nagami, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 344 days.

(21) Appl. No.: 17/804,027

(22) Filed: May 25, 2022

(65) Prior Publication Data

US 2022/0384154 A1 Dec. 1, 2022

(30) Foreign Application Priority Data

May 27, 2021 (JP) .................................. 2021-089004

(51) Int. Cl.
*H01J 37/32* (2006.01)

(52) U.S. Cl.
CPC .. *H01J 37/32568* (2013.01); *H01J 37/32577* (2013.01); *H01J 37/32642* (2013.01); *H01J 37/32715* (2013.01); *H01J 37/32082* (2013.01); *H01J 2237/2007* (2013.01); *H01J 2237/334* (2013.01)

(58) Field of Classification Search
CPC .......... H01J 37/32568; H01J 37/32577; H01J 37/32642; H01J 37/32715; H01J 2237/2007; H01J 2237/334; H01J 37/32082; H01J 2237/332–3348

USPC ..... 156/345.51, 345.1–345.55; 118/715–733
See application file for complete search history.

(56) References Cited

U.S. PATENT DOCUMENTS

| | | | | |
|---|---|---|---|---|
| 6,376,808 | B2* | 4/2002 | Tachikawa | H05B 3/68 |
| | | | | 219/541 |
| 2002/0108714 | A1* | 8/2002 | Doering | C23C 16/54 |
| | | | | 118/728 |
| 2003/0089600 | A1* | 5/2003 | Natsuhara | H01L 21/6831 |
| | | | | 118/500 |
| 2004/0261946 | A1 | 12/2004 | Endoh et al. | |

(Continued)

FOREIGN PATENT DOCUMENTS

| | | |
|---|---|---|
| JP | H06-236858 A | 8/1994 |
| JP | H11-097430 A | 4/1999 |

(Continued)

*Primary Examiner* — Charlee J. C. Bennett
(74) *Attorney, Agent, or Firm* — Studebaker & Brackett PC

(57) ABSTRACT

In a disclosed plasma processing apparatus, an electrostatic chuck provided in a chamber includes a first region on which a substrate is placed and a second region on which an edge ring is placed. The first region includes a first electrode provided therein. The second region including a second electrode provided therein. A first feed line connects the first electrode and a bias power supply generating a pulse of a voltage applied to the first electrode to each other. A second feed line connects the second electrode and the bias power supply or another bias power supply generating a pulse of the voltage applied to the second electrode to each other. The second feed line includes one or more sockets and one or more feed pins. The one or more feed pins have flexibility in a radial direction thereof and are fitted into the one or more sockets.

3 Claims, 6 Drawing Sheets

(56) References Cited

U.S. PATENT DOCUMENTS

| | | | | |
|---|---|---|---|---|
| 2010/0000970 A1* | 1/2010 | Koshimizu | ....... | H01J 37/32642 |
| | | | | 156/345.48 |
| 2010/0326957 A1* | 12/2010 | Maeda | .................... | H01J 37/20 |
| | | | | 156/345.26 |
| 2012/0164834 A1* | 6/2012 | Jennings | ........... | H01J 37/32541 |
| | | | | 118/723 R |
| 2013/0180662 A1* | 7/2013 | Sato | ................ | H01L 21/68785 |
| | | | | 156/345.51 |
| 2014/0087587 A1* | 3/2014 | Lind | ................ | H01J 37/32532 |
| | | | | 439/527 |
| 2016/0079107 A1* | 3/2016 | Aramaki | ........... | H01J 37/32715 |
| | | | | 156/345.51 |
| 2016/0181132 A1* | 6/2016 | Anella | ................. | H05B 3/0047 |
| | | | | 219/494 |
| 2016/0322242 A1 | 11/2016 | Nguyen et al. | | |
| 2020/0219701 A1* | 7/2020 | Koshimizu | ....... | H01J 37/32183 |
| 2022/0115216 A1* | 4/2022 | Ichino | ............... | H01L 21/67069 |

FOREIGN PATENT DOCUMENTS

| | | |
|---|---|---|
| JP | 2004-505446 A | 2/2004 |
| JP | 2004-531880 A | 10/2004 |
| JP | 2018-190978 A | 11/2018 |
| WO | 02/09162 A2 | 1/2002 |
| WO | 02/073654 A1 | 9/2002 |
| WO | 2021/021531 A1 | 2/2021 |

* cited by examiner

PLASMA PROCESSING APPARATUS

CROSS-REFERENCE TO RELATED APPLICATIONS

This application is based on and claims the benefit of priority from Japanese Patent Application No. 2021-089004 filed on May 27, 2021, the entire contents of which are incorporated herein by reference.

TECHNICAL FIELD

Exemplary embodiments of the present disclosure relate to a plasma processing apparatus.

BACKGROUND

Plasma processing apparatuses are used in plasma processing of substrates. U.S. Patent Application Publication No. 2004/0261946 discloses a type of plasma processing apparatus. The specification of the plasma processing apparatus described in U.S. Patent Application Publication No. 2004/0261946 includes a chamber, a substrate support, and a radio-frequency power supply. The substrate support is provided in the chamber. The substrate support is configured to support a substrate and an edge ring. The radio-frequency power supply is configured to supply radio-frequency power to generate plasma from a gas supplied into the chamber.

SUMMARY

In an exemplary embodiment, a plasma processing apparatus is provided. The plasma processing apparatus is provided with a chamber, an electrostatic chuck, a first feed line, and a second feed line. The electrostatic chuck includes a first region on which a substrate is placed and a second region on which an edge ring is placed. The first region includes a first electrode provided therein. The second region including a second electrode provided therein. The first feed line connects the first electrode and a bias power supply generating a pulse of a voltage applied to the first electrode to each other. The second feed line connects the second electrode and the bias power supply or another bias power supply generating a pulse of the voltage applied to the second electrode to each other. The second feed line includes one or more sockets and one or more feed pins. The one or more feed pins have flexibility in a radial direction thereof and are fitted into the one or more sockets.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
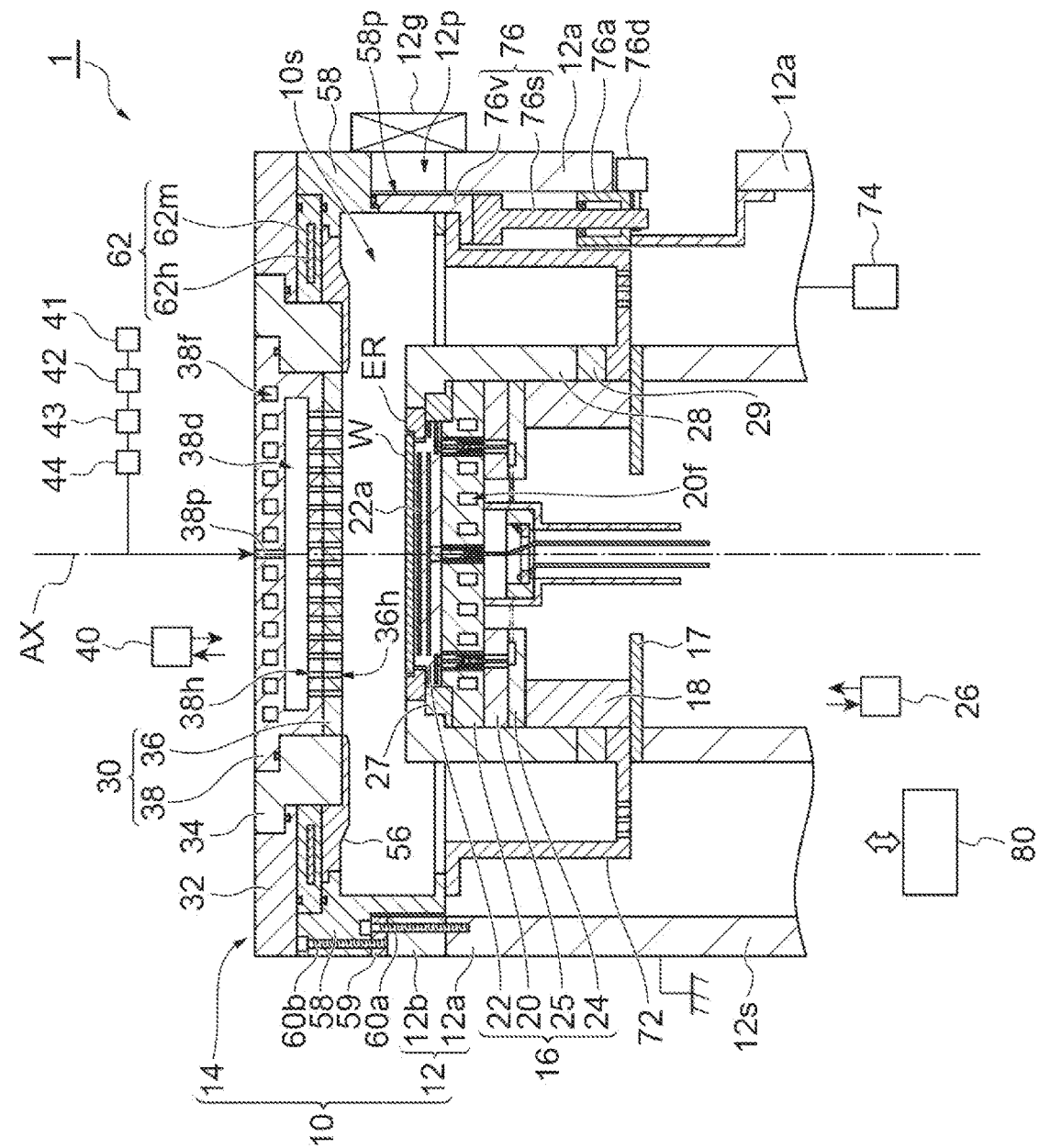
FIG. 1 is a view schematically illustrating a plasma processing apparatus according to an exemplary embodiment.

Hereinafter, various exemplary embodiments will be described.

In an exemplary embodiment, a plasma processing apparatus is provided. The plasma processing apparatus is provided with a chamber, an electrostatic chuck, a first feed line, and a second feed line. The electrostatic chuck includes a first region on which a substrate is placed and a second region on which an edge ring is placed. The first region includes a first electrode provided therein. The second region including a second electrode provided therein. The first feed line connects the first electrode and a bias power supply generating a pulse of a voltage applied to the first electrode to each other. The second feed line connects the second electrode and the bias power supply or another bias power supply generating a pulse of the voltage applied to the second electrode to each other. The second feed line includes one or more sockets and one or more feed pins. The one or more feed pins have flexibility in a radial direction thereof and are fitted into the one or more sockets.

Since each of one or more feed pins of a second feed line has flexibility in a radial direction thereof, the feed pin is reduced in diameter by being fitted into the corresponding socket. Accordingly, each of the one or more feed pins of the second feed line is held by the corresponding socket to reliably come into contact with the corresponding socket. Therefore, according to the above embodiment, it is possible to stably supply the pulse of a voltage, which is bias energy, to an edge ring.

In an exemplary embodiment, the second feed line may include a plurality of sockets as the one or more sockets and may include a plurality of feed pins fitted into the plurality of sockets, respectively, as the one or more feed pins. The second feed line may include a common line and a plurality of branch lines. The plurality of branch lines are branched from the common line and connected to the second electrode. Each of the plurality of branch lines includes one of the plurality of sockets and one of the plurality of feed pins.

In an exemplary embodiment, the first feed line may include a socket and a feed pin. The feed pin of the first feed line may have flexibility in a radial direction thereof and may be fitted into the socket of the first feed line.

In an exemplary embodiment, the plasma processing apparatus may further comprise a base and a feed pipe. The electrostatic chuck is provided on the base. The feed pipe is configured to transmit radio-frequency power to the base and extends in a vertical direction below the base. The common line and the first feed line extend upward through an inner hole of the feed pipe.

In an exemplary embodiment, the second feed line may include an annular member having conductivity. The common line may be connected to the annular member. The first feed line may extend upward through an inner hole of the annular member. The plurality of branch lines may be connected between the annular member and the second electrode, and may extend in a radial direction from the annular member.

In an exemplary embodiment, the plurality of branch lines may have substantially the same length.

Hereinafter, various exemplary embodiments will be described in detail with reference to the drawings. In the drawings, the same or equivalent portions are denoted by the same reference symbols.

FIG. 1 is a view schematically illustrating a plasma processing apparatus according to an exemplary embodiment. The plasma processing apparatus 1 illustrated in FIG. 1 includes a chamber 10. The chamber 10 provides an internal space 10s therein. The internal space 10s can be depressurized. Plasma is generated in the internal space 10s.

The chamber 10 may include a chamber body 12 and a top portion 14. The chamber body 12 configures a side wall and a bottom portion of the chamber 10. The chamber body 12 has a substantially cylindrical shape. A central axis of the chamber body 12 substantially coincides with an axis AX that extends in the vertical direction. The chamber body 12 is electrically grounded. The chamber body 12 is formed of, for example, aluminum. A corrosion-resistant film is formed on the surface of the chamber body 12. The corrosion-resistant film is formed of, for example, a material such as aluminum oxide or yttrium oxide.

An opening 12p is formed on the side wall of the chamber 10. The opening 12p is provided by the chamber body 12. The opening 12p is openable and closable by a gate valve 12g. A substrate W passes through the opening 12p when being transferred between the internal space 10s and the outside of the chamber 10.

The chamber body 12 may include a first member 12a and a second member 12b. The first member 12a has a substantially cylindrical shape. The first member 12a configures the bottom portion and a part of the side wall of the chamber 10. The second member 12b has a substantially cylindrical shape. The second member 12b is provided on the first member 12a. The second member 12b configures another part of the side wall of the chamber 10. The second member 12b provides an opening 12p.

The plasma processing apparatus 1 further includes a substrate support 16. The substrate support 16 is provided in the internal space 10s. The substrate support 16 is configured to support the substrate W placed thereon. A bottom plate 17 is provided below the substrate support 16. The bottom plate 17 is supported by the bottom portion of the chamber 10, for example, the first member 12a. A support 18 extends upward from the bottom plate 17. The support 18 has a substantially cylindrical shape. The support 18 is formed of, for example, an insulating material such as quartz. The substrate support 16 is mounted on the support 18 and is supported by the support 18.

The substrate support 16 includes a base 20 and an electrostatic chuck 22. The base 20 has a substantial disk shape. A central axis of the base 20 substantially coincides with the axis AX. The base 20 is formed of a conductor such as aluminum. A flow channel 20f is formed in the base 20. The flow channel 20f extends, for example, in a spiral shape. Refrigerant is supplied to the flow channel 20f from the chiller unit 26. The chiller unit 26 is provided outside the chamber 10. The chiller unit 26 supplies, for example, a liquid refrigerant to the flow channel 20f. The refrigerant supplied to the flow channel 20f flows through the flow channel 20f and is returned to the chiller unit 26.

The electrostatic chuck 22 is provided on the base 20. The electrostatic chuck 22 has a substantial disk shape. The electrostatic chuck 22 is configured to hold the substrate W placed thereon by electrostatic attraction. Additionally, the electrostatic chuck 22 is configured to support an edge ring ER placed thereon. The edge ring ER is formed of, for example, silicon, quartz, or silicon carbide. The edge ring ER is used to improve the in-plane uniformity of plasma processing with respect to the substrate W. The substrate W is disposed in a region surrounded by the edge ring ER and on the electrostatic chuck 22.

The substrate support 16 may further include a ring 27, a tubular portion 28, and a tubular portion 29. The ring 27 is provided between the edge ring ER and the base 20. The ring 27 is formed of an insulating material. The tubular portion 28 extends along the outer peripheries of the base 20, the ring 27, and the support 18. The tubular portion 28 is provided on the tubular portion 29. The tubular portion 28 is formed of an insulating material having corrosion resistance. The tubular portion 28 is formed of, for example, quartz. The tubular portion 29 extends along the outer periphery of the support 18. The tubular portion 29 is formed of an insulating material having corrosion resistance. The tubular portion 29 is formed of, for example, quartz.

The top portion 14 is provided to close an upper end opening of the chamber 10. The top portion 14 includes an upper electrode 30. The top portion 14 may further include a member 32 and a member 34. The member 32 is a substantially annular plate and is formed of a metal such as aluminum. The member 32 is provided on the side wall of the chamber 10 via a member 58 described below. That is, the member 32 is provided on the member 58. The member 34 is provided between the upper electrode 30 and the member 32. The member 34 extends in a circumferential direction with respect to the axis AX. The member 34 is formed of an insulating material such as quartz. The upper electrode 30 is disposed via the member 34 in an opening defined by the member 32. The upper electrode 30 is supported by the member 32 via the member 34.

The upper electrode 30 includes a ceiling plate 36 and a support 38. The ceiling plate 36 has a substantial disk shape. The ceiling plate 36 is in contact with the internal space 10s. A plurality of gas discharge holes 36h are formed on the ceiling plate 36. The plurality of gas discharge holes 36h penetrate the ceiling plate 36 in a plate thickness direction (vertical direction). The ceiling plate 36 is formed of silicon, aluminum oxide, or quartz. Alternatively, the ceiling plate 36 may be configured by forming a corrosion-resistant film on the surface of a member made of a conductor such as aluminum. The corrosion-resistant film is formed of for example, a material such as aluminum oxide or yttrium oxide.

The support 38 is provided on the ceiling plate 36. The support 38 supports the ceiling plate 36 in a detachable manner. The support 38 is formed of for example, aluminum. A flow channel 38f is formed in the support 38. The flow channel 38f extends, for example, in a spiral shape in the support 38. Refrigerant is supplied to the flow channel 38f from the chiller unit 40. The chiller unit 40 is provided outside the chamber 10. The chiller unit 40 supplies a liquid refrigerant (for example, cooling water) to the flow channel 38f. The refrigerant supplied to the flow channel 38f flows through the flow channel 38f and is returned to the chiller unit 40.

A gas diffusion chamber 38d is formed inside the support 38. A plurality of holes 38h are formed in the support 38. The plurality of holes 38h extend downward from the gas diffusion chamber 38d and are connected to the plurality of gas discharge holes 36h, respectively. The support 38 is provided with a port 38p. The port 38p is connected to the gas diffusion chamber 38d. A gas source group 41 is connected to the port 38p via a valve group 42, a flow rate controller group 43, and a valve group 44.

The gas source group 41 includes a plurality of gas sources. Each of the valve group 42 and the valve group 44 includes a plurality of valves. The flow rate controller group 43 includes a plurality of flow rate controllers. Each of the plurality of flow rate controllers is a mass flow controller or a pressure-controlled flow rate controller. Each of the plurality of gas sources of the gas source group 41 is connected to the port 38p via the corresponding valve of the valve group 44, the corresponding flow rate controller of the flow rate controller group 43, and the corresponding valve of the valve group 42. In the plasma processing apparatus 1, gas from each of one or more gas sources selected from the plurality of gas sources in the gas source group 41 is supplied to the gas diffusion chamber 38d. The gas supplied to the gas diffusion chamber 38d is supplied to the internal space 10s from the plurality of gas discharge holes 36h.

The plasma processing apparatus 1 further includes a member 58. The member 58 is partially provided in the internal space 10s. That is, a part of the member 58 is exposed to plasma in the internal space 10s. The member 58 extends from the internal space 10s toward the outside of the chamber 10 and is exposed to a space outside the chamber 10.

The member 58 extends along an inner wall surface of the chamber 10 to prevent the accumulation of by-products resulting from the plasma processing on the inner wall surface of the chamber 10. Specifically, the member 58 extends along the inner wall surface of the chamber body 12 or the inner wall surface of the second member 12b. The member 58 has a substantially cylindrical shape. The member 58 may be configured by forming a corrosion-resistant film on the surface of a member made of a conductor such as aluminum. The corrosion-resistant film is formed of a material such as aluminum oxide or yttrium oxide.

The member 58 is held between the chamber body 12 and the top portion 14. For example, the member 58 is held between the second member 12b of the chamber body 12 and the member 32 of the top portion 14.

The plasma processing apparatus 1 may further include a spacer 59. The spacer 59 has a plate shape and extends in the circumferential direction around the axis AX. The spacer 59 is provided between the member 58 and the chamber 10. The spacer 59 is formed of, for example, a conductor. The spacer 59 may be formed of a material having a thermal conductivity lower than that of aluminum. The spacer 59 may be formed of, for example, stainless steel. The spacer 59 may be formed of a material other than the stainless steel as long as a material having a thermal conductivity lower than that of aluminum is provided. Alternatively, the spacer 59 may be formed of aluminum.

The spacer 59 is provided between the member 58 and the second member 12b. The spacer 59 and the second member 12b are fixed to the first member 12a by using a screw 60a. The screw 60a penetrates the spacer 59 and the second member 12b and is screwed into a screw hole of the first member 12a. The member 58 is fixed to the spacer 59 by using a screw 60b. The screw 60b penetrates the member 58 and is screwed into the screw hole of the spacer 59.

The plasma processing apparatus 1 may further include a heater unit 62. The heater unit 62 includes a main body 62m and a heater 62h. The heater 62h is configured to heat the member 58. The heater 62h can be a resistance heating element. The heater 62h is provided in the main body 62m. The main body 62m is in thermal contact with the member 58. The main body 62m is in physical contact with the member 58. The main body 62m is formed of a conductor such as aluminum. The heater 62h is configured to heat the member 58 via the main body 62m.

The main body 62m is a substantially annular plate and extends in the circumferential direction to surround the upper electrode 30. In an embodiment, the top portion 14 further includes a member 56. The member 56 is a substantially annular plate. The member 56 extends in the circumferential direction in a region radially outside the ceiling plate 36. The radial direction is a radial direction with respect to the axis AX. The heater unit 62 is provided between the member 56 and the member 32 and between the member 34 and the member 58.

A baffle member 72 is provided between the member 58 and the support 18. In an embodiment, the baffle member 72 has a substantially cylindrical shape. An upper end of the baffle member 72 is formed in a flange shape. A lower end of the baffle member 72 is formed in a substantially annular shape and extends radially inward. An outer edge of the upper end of the baffle member 72 is coupled to a lower end of the member 58. An inner edge of the lower end of the baffle member 72 is held between the tubular portion 29 and the bottom plate 17. The baffle member 72 is formed of a plate made of a conductor such as aluminum. A corrosion-resistant film is formed on the surface of the baffle member 72. The corrosion-resistant film is formed of, for example, a material such as aluminum oxide or yttrium oxide. A plurality of through-holes are formed in the baffle member 72.

The internal space 10s includes an exhaust region that extends below the baffle member 72. An exhaust device 74 is connected to the exhaust region. The exhaust device 74 includes a pressure regulator such as an automatic pressure control valve and a decompression pump such as a turbo molecular pump.

An opening 58p is formed in the member 58. The opening 58p is formed in the member 58 to face the opening 12p. The substrate W passes through the openings 12p and 58p when being transferred between the internal space 10s and the outside of the chamber 10.

The plasma processing apparatus 1 may further include a shutter mechanism 76. The shutter mechanism 76 is configured to open and close the opening 58p. The shutter mechanism 76 has a valve 76v and a shaft 76s. The shutter mechanism 76 may further include a tubular body 76a and a driver 76d.

The valve 76v closes the opening 58p in a state in which the valve 76v is disposed in the opening 58p. The valve 76v is supported by the shaft 76s. That is, the shaft 76s is coupled to the valve 76v. The shaft 76s extends downward from the valve 76v.

The tubular body 76a has a tubular shape. The tubular body 76a is directly or indirectly fixed to the chamber body 12. The shaft 76s is movable up and down through the inside of the tubular body 76a. The driver 76d generates power for moving the shaft 76s up and down. The driver 76d includes, for example, a motor.

In an embodiment, the plasma processing apparatus 1 may further include a controller 80. The controller 80 is configured to control each part of the plasma processing apparatus 1. The controller 80 is, for example, a computer device. The controller 80 has a processor, a storage unit, an input device such as a keyboard, a display device, and an input and output interface for signals. A control program and recipe data are stored in the storage unit. The processor executes the control program and sends a control signal to each unit of the plasma processing apparatus 1 via the input and output interface in accordance with the recipe data.

Figure 2:
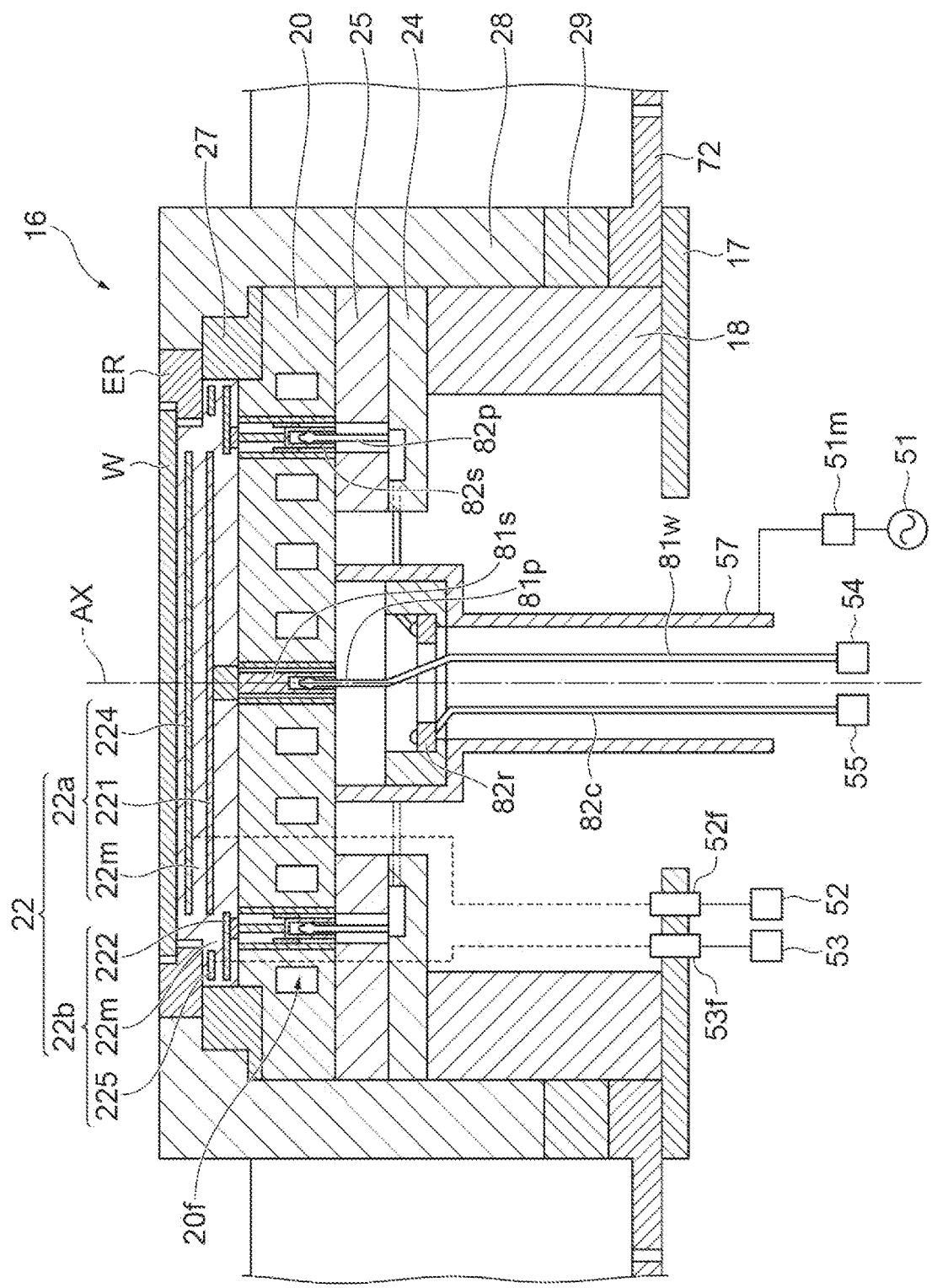
FIG. 2 is a cross-sectional view of a substrate support of a plasma processing apparatus according to an exemplary embodiment.
Figure 3:
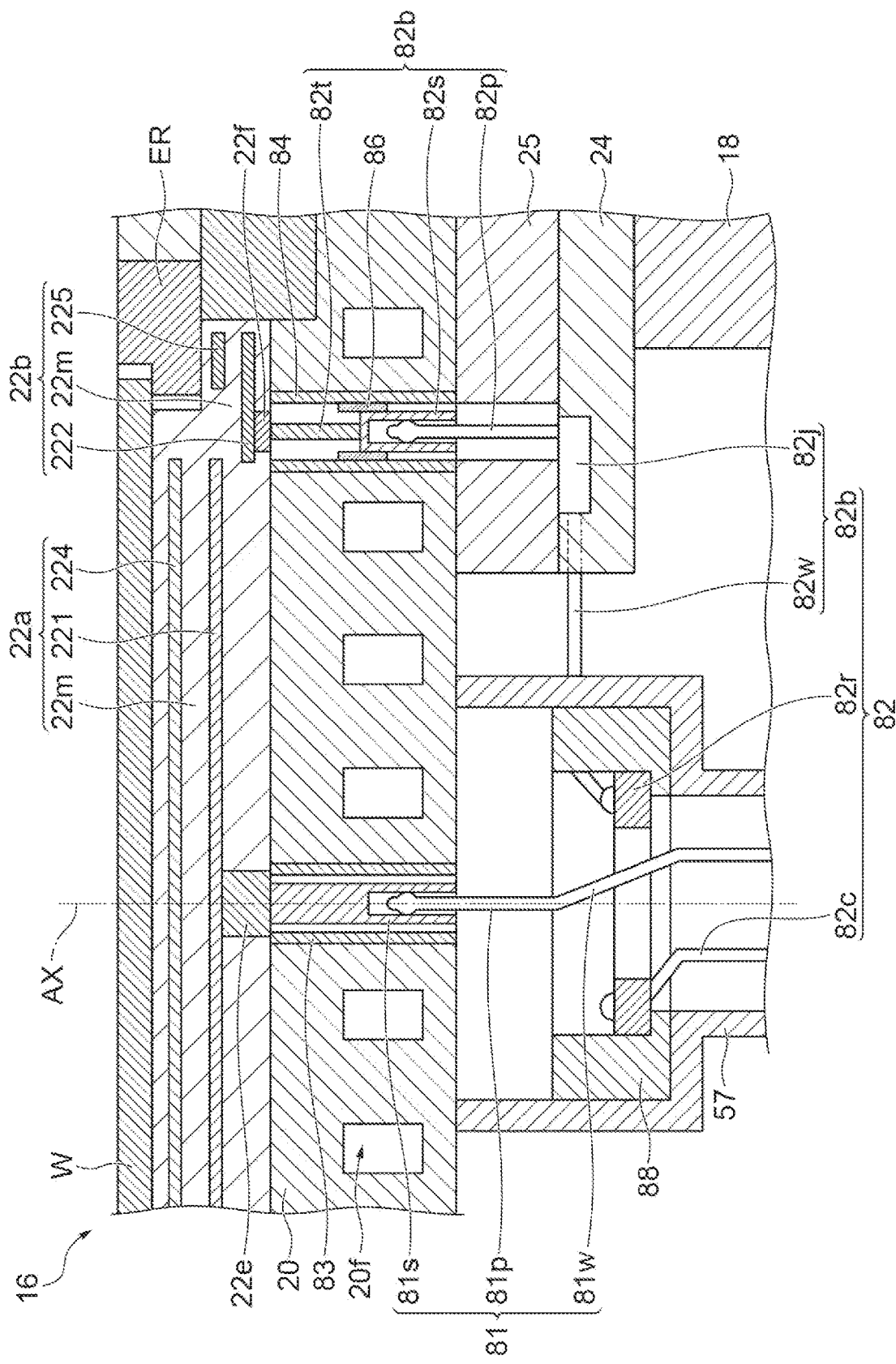
FIG. 3 is a partially enlarged cross-sectional view of the substrate support of a plasma processing apparatus according to an exemplary embodiment.

Hereinafter, the substrate support 16 of the plasma processing apparatus 1 and the configuration related thereto will be described in detail. In the following description, reference will be made to FIGS. 2 and 3 in addition to FIG. 1. FIG. 2 is a cross-sectional view of the substrate support of the plasma processing apparatus according to an exemplary embodiment. FIG. 3 is a partially enlarged cross-sectional view of the substrate support of the plasma processing apparatus according to an exemplary embodiment.

As described above, in an embodiment, the substrate support 16 includes the base 20. A feed pipe 57 extends downward below the base 20. The feed pipe 57 is a pipe formed of a conductor. A central axis of the feed pipe 57 substantially coincides with the axis AX. An upper end of the feed pipe 57 is connected to the base 20.

The plasma processing apparatus 1 further includes a radio-frequency power supply 51. The radio-frequency power supply 51 is connected to the feed pipe 57 via a matcher 51m and is connected to the base 20 via the feed pipe 57. The radio-frequency power supply 51 is a power supply configured to generate radio-frequency power for plasma generation. The frequency of the radio-frequency power generated by the radio-frequency power supply 51 is, for example, a frequency of 13.56 MHz or more and 150 MHz or less. The matcher 51m has a matching circuit for matching the impedance of a load side (base 20 side) of the radio-frequency power supply 51 with the output impedance of the radio-frequency power supply 51. In another embodiment, the radio-frequency power supply 51 may be connected to the upper electrode 30 via the matcher 51m instead of the base 20.

As described above, the electrostatic chuck 22 is provided on the base 20. The electrostatic chuck 22 provides a first region 22a and a second region 22b. The first region 22a is configured to support the substrate W placed on thereon. The second region 22b is configured to support the edge ring ER placed thereon. The first region 22a is a substantially circular region in a plan view, and a central axis thereof substantially coincides with the axis AX. The second region 22b is a substantially annular region in a plan view and extends in the circumferential direction to surround the first region 22a.

The electrostatic chuck 22 includes a dielectric portion 22m. The dielectric portion 22m is formed of ceramic such as aluminum oxide and aluminum nitride. The dielectric portion 22m has a substantial disk shape. A central region of the dielectric portion 22m configures the first region 22a, and a peripheral region of the dielectric portion 22m configures the second region 22b.

The first region 22a includes a chuck electrode 224. The chuck electrode 224 is a film formed of a conductive material and is provided in the dielectric portion 22m in the first region 22a. The chuck electrode 224 may have a substantially circular shape in a plan view. A DC power supply 52 is electrically connected to the chuck electrode 224 via a filter 52f. The filter 52f is a low-pass filter. When a DC voltage from the DC power supply 52 is applied to the chuck electrode 224, an electrostatic attraction force is generated between the first region 22a and the substrate W placed on the first region 22a. The substrate W is attracted to the first region 22a by the generated electrostatic attraction force and is held by the electrostatic chuck 22 on the first region 22a.

The first region 22a further includes a first electrode 221. The first electrode 221 is a film formed of a conductive material. The first electrode 221 is provided in the dielectric portion 22m in the first region 22a. The first electrode 221 may be provided such that the chuck electrode 224 is located between an upper surface of the first region 22a and the first electrode 221. The first electrode 221 may have a substantially circular shape in a plan view.

The plasma processing apparatus 1 further includes a first feed line 81. The first feed line 81 connects a bias power supply 54 and the first electrode 221 to each other. Details of the first feed line 81 will be described below.

The bias power supply 54 generates a pulse of a voltage applied to the first electrode 221 as bias energy to draw ions into the substrate W from the plasma generated in the chamber 10. The pulse of the voltage may be a negative pulse of the voltage or a positive pulse of the voltage. The pulse of the voltage may have any waveform, such as a rectangular pulse or a triangular pulse. The bias power supply 54 may periodically apply the pulse of the voltage to the first electrode 221. The time length of a cycle in which the pulse of the voltage is applied from the bias power supply 54 to the first electrode 221 is the reciprocal of a bias frequency. The bias frequency is, for example, a frequency in a range of 100 kHz or more and 13.56 MHz or less.

The second region 22b includes a chuck electrode 225. The chuck electrode 225 is a film formed of a conductive material and is provided in the dielectric portion 22m in the second region 22b. The chuck electrode 225 may have a substantially annular shape in a plan view or may extend around the axis AX. A DC power supply 53 is electrically connected to the chuck electrode 225 via a filter 53f. The filter 53f is a low-pass filter. When a DC voltage from the DC power supply 53 is applied to the chuck electrode 225, an electrostatic attraction force is generated between the second region 22b and the edge ring ER placed on the second region 22b. The edge ring ER is attracted to the second region 22b by the generated electrostatic attraction force and is held by the electrostatic chuck 22 on the second region 22b. In addition, the second region 22b may include a pair of electrodes configuring a bipolar electrostatic chuck as chuck electrodes.

The second region 22b further includes a second electrode 222. The second electrode 222 is a film formed of a conductive material. The second electrode 222 may have a substantially annular shape in a plan view or may extend around the axis AX. The second electrode 222 is provided in the dielectric portion 22m in the second region 22b. In addition, the chuck electrode 225 may extend between the second electrode 222 and an upper surface of the second region 22b.

The plasma processing apparatus 1 further includes a second feed line 82. The second feed line 82 connects a bias power supply 55 and the second electrode 222 to each other. Details of the second feed line 82 will be described below. Alternatively, the second feed line 82 may connect the bias power supply 54 and the second electrode 222 to each other. In this case, the plasma processing apparatus 1 may not include the bias power supply 55.

The bias power supply 55 generates a pulse of a voltage applied to the second electrode 222 as bias energy to draw ions into the substrate W from the plasma generated in the chamber 10. The pulse of the voltage may be a negative pulse of the voltage or a positive pulse of the voltage. The pulse of the voltage can have any waveform, such as a rectangular pulse or a triangular pulse. The bias power supply 55 may periodically apply the pulse of the voltage to the second electrode 222. The time length of a cycle in which the pulse of the voltage is applied from the bias power supply 55 to the second electrode 222 is the reciprocal of a bias frequency. The bias frequency is, for example, a frequency in a range of 100 kHz or more and 13.56 MHz or less.

In an embodiment, a through-hole is formed substantially in the center of the base 20. An insulator 83 is fitted into the through-hole. The insulator 83 is formed of an insulating material. The insulator 83 may have a substantially cylindrical shape. The electrostatic chuck 22 further includes a terminal 22e. The terminal 22e is connected to the first electrode 221 and is exposed to an inner hole of the insulator 83 at a lower surface of the electrostatic chuck 22.

The first feed line 81 includes a socket 81s and a feed pin 81p. The feed pin 81p and the socket 81s are formed of a conductor, such as a metal. The socket 81s is provided in the inner hole of the insulator 83. The socket 81s has an upper portion including an upper end thereof and a lower portion. The upper portion of the socket 81s may have a substantially columnar shape. The lower portion of the socket 81s may have a substantially cylindrical shape. The upper end of the socket 81s is connected to the terminal 22e. The upper end of the socket 81s is brazed to, for example, the terminal 22e.

Figure 4:
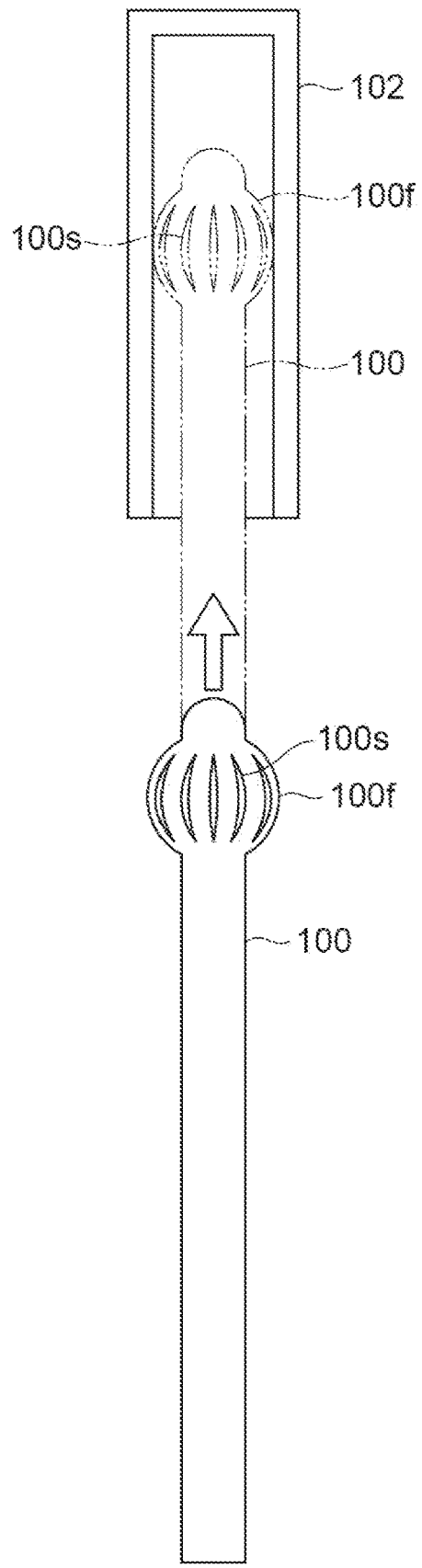
FIG. 4 is a view illustrating a feed pin and a socket that can be adopted in a plasma processing apparatus according to an exemplary embodiment.

FIG. 4 is a view illustrating a feed pin and a socket that can be adopted in the plasma processing apparatus according to an exemplary embodiment. The feed pin 81p may have the same structure as a feed pin 100 illustrated in FIG. 4, and the socket 81s may have the same structure as a socket 102 illustrated in FIG. 4.

The feed pin 100 has a flexible portion 100f as a portion between one end and the other end of the feed pin 100. The flexible portion 100f has a diameter larger than the diameter of other portions of the feed pin 100 in the longitudinal direction. Additionally, the flexible portion 100f has flexibility in the radial direction. That is, the flexible portion 100f is configured to be elastically deformable in the radial direction. In an embodiment, the flexible portion 100f is hollow and provides a plurality of notches 100s arranged in the circumferential direction. In the socket 102, the flexible portion 100f comes into contact with an inner surface of the socket 102 in a state where the diameter of the flexible portion 100f is reduced, and is held by the socket 102.

In the plasma processing apparatus 1, since the feed pin 81p and the socket 81s have the same structure as the feed pin 100 and the socket 102, the feed pin 81p is held by the socket 81s and reliably comes into contact with the socket 81s. Accordingly, the bias energy from the bias power supply 54, that is, the pulse of the voltage is stably supplied to the first electrode 221.

In an embodiment, the first feed line 81 may further include a wiring line 81w. The wiring line 81w connects the feed pin 81p to the bias power supply 54. In an embodiment, the first feed line 81 extends upward through an inner hole of the feed pipe 57. Specifically, parts of the wiring line 81w and the feed pin 81p of the first feed line 81 extend in the inner hole of the feed pipe 57. In an embodiment, an annular member 82r is provided in the feed pipe 57. The first feed line 81 may extend upward through an inner hole of the annular member 82r. Specifically, the wiring line 81w may extend upward through the inner hole of the annular member 82r.

In an embodiment, a plurality of through-holes are formed in the base 20. The plurality of through-holes are arranged in the circumferential direction around the axis AX. A plurality of insulators 84 are fitted in the plurality of through-holes. Each of the plurality of insulators 84 is formed of an insulating material. Each of the plurality of insulators 84 may have a substantially cylindrical shape. The electrostatic chuck 22 further includes a plurality of terminals 22f. Each of the plurality of terminals 22f is connected to the second electrode 222 and is exposed to an inner hole of the corresponding insulator among the plurality of insulators 84 at the lower surface of the electrostatic chuck 22.

The second feed line 82 includes one or more sockets 82s and one or more feed pins 82p. The one or more sockets 82s and the one or more feed pins 82p are formed of a conductor, such as a metal. In an embodiment, the second feed line 82 includes the plurality of sockets 82s and the plurality of feed pins 82p. Each feed pin 82p is fitted in the corresponding socket 82s.

The plurality of sockets 82s extend in the inner holes of the corresponding insulators among the plurality of insulators 84. The plurality of sockets 82s are held by the corresponding insulators among the plurality of insulators 84 via a sleeve 86. The plurality of sockets 82s may have a substantially cylindrical shape closed at upper ends thereof. The upper ends of the plurality of sockets 82s are connected to the plurality of terminals 22f, respectively. In an embodiment, the second feed line 82 includes a plurality of wiring lines 82t. The plurality of wiring lines 82t is composed of, for example, stranded wires. The plurality of wiring lines 82t connect the plurality of sockets 82s to the plurality of terminals 22f respectively.

In the plasma processing apparatus 1, each feed pin 82p and each socket 82s have the same structure as the feed pin 100 and the socket 102. Accordingly, each feed pin 82p is held by the corresponding socket 82s and reliably comes into contact with the corresponding socket 82s. Therefore, the bias energy from the bias power supply 55, that is, the pulse of the voltage is stably supplied to the edge ring ER via the second electrode 222.

Figure 5:
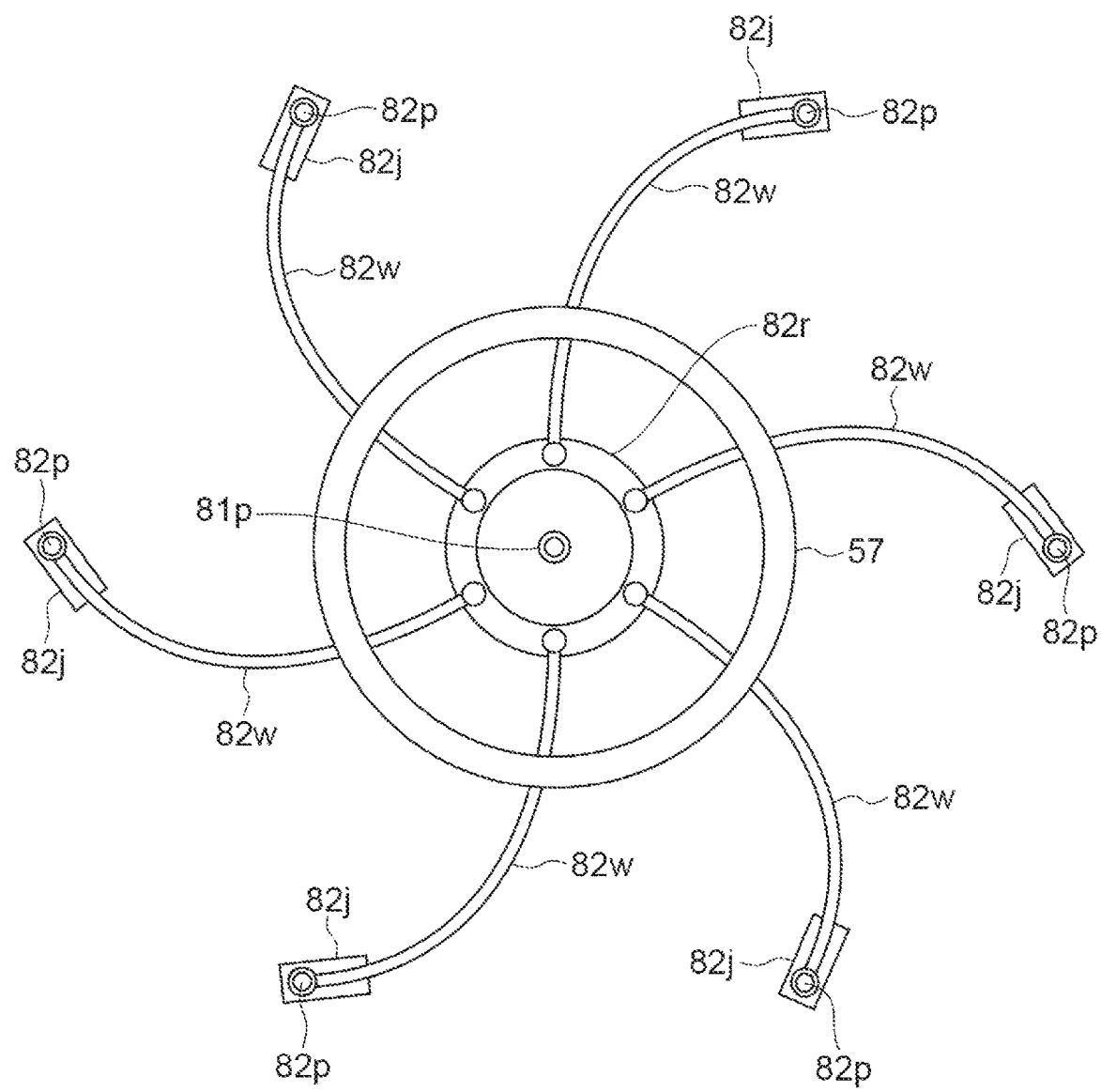
FIG. 5 is a plan view illustrating a second feed line of a plasma processing apparatus according to an exemplary embodiment.

Hereinafter, FIG. 5 will be referred to in addition to FIGS. 1 to 4. FIG. 5 is a plan view illustrating the second feed line of the plasma processing apparatus according to an exemplary embodiment. In an embodiment, the second feed line 82 may include a common line 82c, the annular member 82r, and a plurality of branch lines 82b.

The annular member 82r has an annular shape and is formed of a conductor, such as a metal. A central axis of the annular member 82r substantially coincides with the axis AX. The annular member 82r is provided in the inner hole of the feed pipe 57. The annular member 82r is held by a holder 88 and may be supported by the feed pipe 57 via the holder 88. The holder 88 is formed of an insulating material and is interposed between the feed pipe 57 and the annular member 82r.

The common line 82c is a wiring line formed of a conductor and connects the bias power supply 55 (or the bias power supply 54) to the annular member 82r. The common line 82c extends upward through the inner hole of the feed pipe 57 and is connected to the annular member 82r in the feed pipe 57.

The plurality of branch lines 82b connect the second electrode 222 to the annular member 82r. Each of the plurality of branch lines 82b includes one of the plurality of feed pins 82p and one of the plurality of sockets 82s. The plurality of branch lines 82b may have the same length as each other. The plurality of branch lines 82b may be arranged at equal intervals in the circumferential direction with respect to the axis AX.

In an embodiment, each of the plurality of branch lines 82b may further include a wiring line 82w and a joint 82j. The wiring line 82w extends in the radial direction with respect to the axis AX from one end thereof connected to the annular member 82r and is connected to the joint 82j at the other end thereof. The wiring line 82w extends in the radial direction through a hole of the holder 88 and a hole of the feed pipe 57. The wiring line 82w may be bent between the annular member 82r and the joint 82j. For example, the wiring line 82w may extend in a curved shape between the annular member 82r and the joint 82j.

The joint 82j of each of the plurality of branch lines 82b is held between the member 24 and the member 25. The member 24 and the member 25 are provided between the support 18 and the base 20. One of the plurality of feed pins 82p is connected to each joint 82j of the plurality of branch lines 82b. Each of the plurality of feed pins 82p extends upward from the joint 82j and is fitted into the corresponding socket 82s.

According to the second feed line 82 including the common line 82c, the annular member 82r, and the plurality of branch lines 82b, the bias energy can be equally supplied to the edge ring ER in the circumferential direction.

While various exemplary embodiments have been described above, various additions, omissions, substitutions and changes may be made without being limited to the exemplary embodiments described above. Elements of the different embodiments may be combined to form another embodiment.

For example, the second feed line 82 may include a single feed pin and a single socket.

Additionally, in another embodiment, a plasma processing apparatus may be a capacitively-coupled plasma processing apparatus different from the plasma processing apparatus 1. In yet another embodiment, a plasma processing apparatus may be an inductively coupled plasma processing apparatus, an electron cyclotron resonance (ECR) plasma processing apparatus, or a plasma processing apparatus that generates plasma using a surface wave such as microwaves.

Hereinafter, the first to fourth experiments performed for the evaluation of the plasma processing apparatus 1 will be described. In the first to fourth experiments, plasma etching of a silicon oxide film of a sample substrate was performed using the plasma processing apparatus 1. The plasma processing apparatus 1 used in the first to fourth experiments had six feed pins 82p, six sockets 82s, and six branch lines 82b. The number of branch lines 82b used in the first to fourth experiments, that is, the number of power supply lines was different from each other. In the first experiment, the six feed pins 82p were fitted into the six sockets 82s, respectively. That is, in the first experiment, the bias power supply 55 was connected to the second electrode 222 by using all of the plurality of branch lines 82b. In the second experiment, one feed pin 82p was removed from one socket 82s and the bias power supply 55 was connected to the second electrode 222 by using five branch lines 82b. In the third experiment, the three feed pins 82p were removed from the three sockets 82s and the bias power supply 55 was connected to the second electrode 222 by using the three branch lines 82b. In the fourth experiment, the five feed pins 82p were removed from the five sockets 82s and the bias power supply 55 was connected to the second electrode 222 by using one branch line 82b. Hereinafter, the conditions for the plasma etching in the first to fourth experiments are shown. In addition, in the first to fourth experiments, the radio-frequency power of the radio-frequency power supply 51, the pulse of the voltage of the bias power supply 54, and the pulse of the voltage of the bias power supply 55 were on-off modulated by a repetition frequency of 10 kHz and an ON duty ratio of 60% and synchronized with each other.

Figure 6:
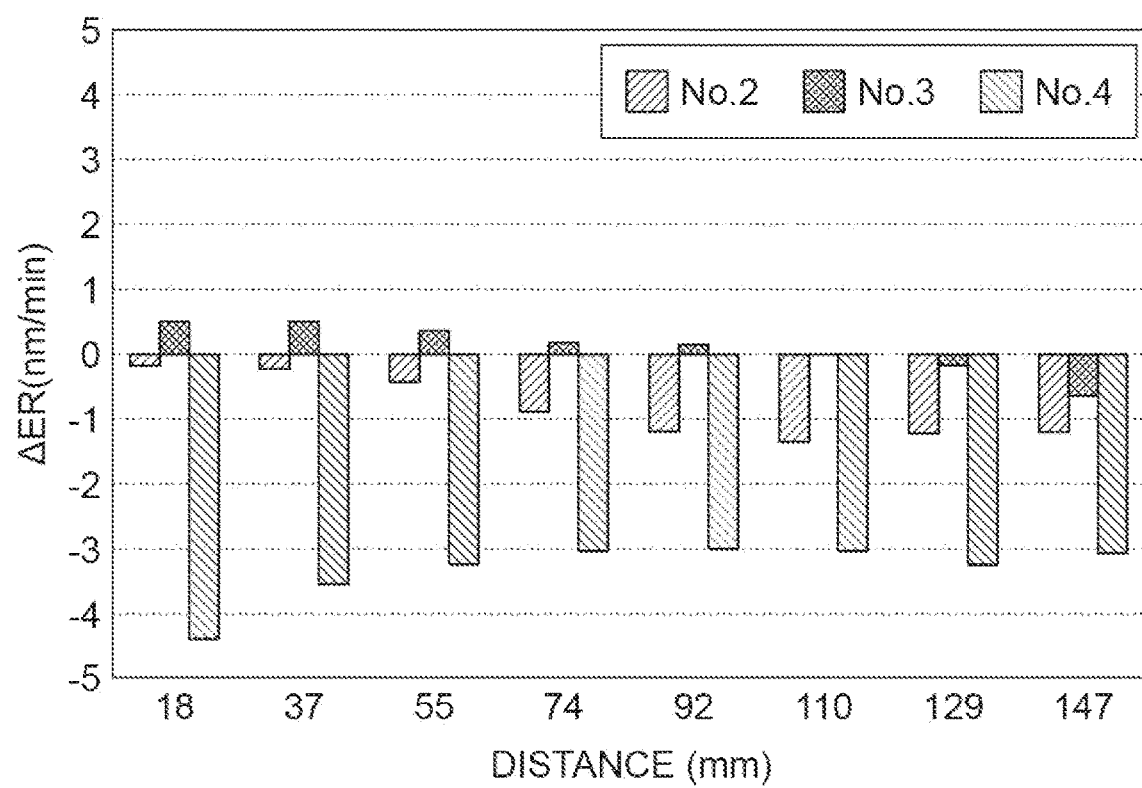
FIG. 6 is a view illustrating experimental results.

<Number of Power Supply Lines in First to Fourth Experiments>
  First experiment (No. 1): 6
  Second experiment (No. 2): 5
  Third experiment (No. 3): 3
  Fourth experiment (No. 4): 1
<Plasma Etching Conditions in First to Fourth Experiments>
  Processing gas: Mixed gas of $CF_4$ gas, $O_2$ gas, and Ar gas
  Pressure in chamber 10: 10 mTorr (1.333 Pa)
  Radio-frequency power of radio-frequency power supply 51: 2500 W and 40 MHz
  Pulse of voltage of bias power supply 54: −3600 V, 400 kHz bias frequency, and 20% ON duty ratio
  Pulse of voltage of bias power supply 55: −360 V, 400 kHz bias frequency, and 20% ON duty ratio In the first to fourth experiments, the etching rates of silicon oxide films at a plurality of positions in the radial direction of the sample substrate were obtained. Then, a difference ΔER between the etching rate of a silicon oxide film at each of the plurality of positions obtained in each of the second to fourth experiments and the etching rate of a silicon oxide film at the corresponding position obtained in the first experiment was determined. FIG. 6 shows the results of the experiments. In FIG. 6, the horizontal axis represents a plurality of positions in the radial direction of the sample substrate as distances from the center of the sample substrate. In FIG. 6, the vertical axis represents ΔER. Additionally, in FIG. 6, No. 2. No. 3, and No. 4 indicate the ΔER of the second to fourth experiments, respectively. As illustrated in FIG. 6, in the fourth experiment, that is a case where the bias power supply 55 is connected to the second electrode 222 by using only one branch line among the six branch lines 82b, ΔER has a negative value having a large absolute value. Accordingly, the etching rate was significantly decreased. On the other hand, in a case where the bias power supply 55 was connected to the second electrode 222 by using more branch lines 82b, the absolute value of ΔER becomes smaller. Accordingly, it was confirmed that it is preferable to use a plurality of branch lines 82b.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a chamber;
   an electrostatic chuck including a first region on which a substrate is placed and a second region on which an edge ring is placed, the first region including a first electrode provided therein, and the second region including a second electrode provided therein;
   a base on which the electrostatic chuck is provided;
   a feed pipe provided to transmit radio-frequency power to the base and extending in a vertical direction below the base;
   a first feed line that connects the first electrode and a bias power supply generating a pulse of a voltage applied to the first electrode to each other; and
   a second feed line that connects the second electrode and the bias power supply or another bias power supply generating a pulse of the voltage applied to the second electrode to each other, wherein
   the second feed line includes a plurality of sockets and a plurality of feed pins, the plurality of feed pins have flexibility in a radial direction thereof and are fitted into the plurality of sockets,
the second feed line includes
  a common line, and
  a plurality of branch lines that are branched from the common line and connected to the second electrode,
each of the plurality of branch lines includes one of the plurality of sockets and one of the plurality of feed pins,
the common line and the first feed line extend upward through an inner hole of the feed pipe,
the second feed line includes an annular member having conductivity,
the common line is connected to the annular member,
the first feed line extends upward through an inner hole of the annular member, and
the plurality of branch lines are connected between the annular member and the second electrode, and extend in a radial direction from the annular member.

2. The plasma processing apparatus according to claim 1, wherein
  the first feed line includes a socket and a feed pin, and
  the feed pin of the first feed line has flexibility in a radial direction thereof and is fitted into the socket of the first feed line.

3. The plasma processing apparatus according to claim 1, wherein the plurality of branch lines have substantially a same length.

* * * * *